United States Patent
Unami et al.

(10) Patent No.: US 11,509,283 B2
(45) Date of Patent: *Nov. 22, 2022

(54) RESONANCE DEVICE

(71) Applicant: Murata Manufacturing Co., Ltd., Nagaokakyo (JP)

(72) Inventors: Toshihiko Unami, Nagaokakyo (JP); Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 826 days.

This patent is subject to a terminal disclaimer.

(21) Appl. No.: 16/435,729

(22) Filed: Jun. 10, 2019

(65) Prior Publication Data

US 2019/0296712 A1 Sep. 26, 2019

Related U.S. Application Data

(63) Continuation of application No. PCT/JP2017/025603, filed on Jul. 13, 2017.

(30) Foreign Application Priority Data

Dec. 27, 2016 (JP) .............................. JP2016-253232

(51) Int. Cl.
*H03H 9/02* (2006.01)
*G01K 1/16* (2006.01)
(Continued)

(52) U.S. Cl.
CPC .......... *H03H 9/02448* (2013.01); *G01K 1/16* (2013.01); *G01K 7/16* (2013.01); *H03H 9/02* (2013.01);
(Continued)

(58) Field of Classification Search
CPC ........ H03H 9/02448; H03H 9/02; H03H 9/13; H03H 9/171; H03H 9/24; H03H 9/2426;
(Continued)

(56) References Cited

U.S. PATENT DOCUMENTS 5,929,438 A * 7/1999 Suzuki .................. G01Q 60/58
977/867
7,427,905 B2 * 9/2008 Lutz ..................... H03H 9/2426
333/197
(Continued)

FOREIGN PATENT DOCUMENTS

JP 2013512635 A 4/2013

OTHER PUBLICATIONS

International Search Report issued in PCT/JP2017/025603, dated Oct. 3, 2017.
(Continued)

*Primary Examiner* — Nathaniel T Woodward
*Assistant Examiner* — Philip L Cotey
(74) *Attorney, Agent, or Firm* — ArentFox Schiff LLP

(57) ABSTRACT

A resonance device with improved precision of temperature control. The resonance device includes a platform; a resonator including a vibrator and one or more holding arms that connect the vibrator and the platform to each other such that a first groove is provided around the vibrator. Moreover, the resonance device includes a sensor with a measurement portion that measures temperature and a heater formed on the platform. A second groove is provided between the measurement portion and the heater.

20 Claims, 9 Drawing Sheets

(51) Int. Cl.
*G01K 7/16* (2006.01)
*H03H 9/13* (2006.01)
*H03H 9/17* (2006.01)
*H03H 9/24* (2006.01)
*H03H 9/15* (2006.01)
*G01K 7/18* (2006.01)

(52) U.S. Cl.
CPC .............. *H03H 9/13* (2013.01); *H03H 9/171* (2013.01); *H03H 9/24* (2013.01); *G01K 7/18* (2013.01); *H03H 9/2426* (2013.01); *H03H 2009/155* (2013.01); *H03H 2009/2442* (2013.01)

(58) Field of Classification Search
CPC ..... H03H 2009/155; H03H 2009/2442; G01K 1/16; G01K 7/16; G01K 7/18
See application file for complete search history.

(56) References Cited

U.S. PATENT DOCUMENTS

| | | | | |
|---|---|---|---|---|
| 7,868,403 | B1* | 1/2011 | Ivanov | H03H 3/0073 257/417 |
| 7,914,203 | B2* | 3/2011 | Mortet | G01N 29/245 73/64.53 |
| 8,410,868 | B2* | 4/2013 | Schoepf | H03H 9/1057 333/186 |
| 10,069,500 | B2* | 9/2018 | Kaajakari | H03H 9/02102 |
| 10,425,084 | B2* | 9/2019 | Kaajakari | H03L 1/04 |
| 2004/0245586 | A1* | 12/2004 | Partridge | B81C 1/00301 438/48 |
| 2005/0242904 | A1* | 11/2005 | Lutz | H03H 9/02401 333/200 |
| 2010/0315179 | A1* | 12/2010 | Schoepf | H03H 9/02448 333/186 |
| 2011/0080224 | A1* | 4/2011 | Lander | B81B 3/0072 331/154 |
| 2011/0175492 | A1* | 7/2011 | Stoffels | H03H 9/02448 310/343 |
| 2011/0210801 | A1* | 9/2011 | Rottenberg | H03H 9/2463 331/156 |
| 2012/0075026 | A1* | 3/2012 | Ruby | H03H 9/0538 331/70 |
| 2012/0268216 | A1* | 10/2012 | Borremans | G05D 23/1928 331/70 |
| 2012/0280594 | A1* | 11/2012 | Chen | H03H 9/02535 310/313 R |
| 2012/0305542 | A1* | 12/2012 | Donnay | H03L 1/04 219/412 |
| 2013/0027141 | A1* | 1/2013 | Koyama | H03H 3/02 331/66 |
| 2013/0194057 | A1* | 8/2013 | Ruby | H03H 9/172 310/343 |
| 2016/0240762 | A1* | 8/2016 | Carr | H01L 35/32 |
| 2018/0234052 | A1* | 8/2018 | Noto | H03B 5/04 |

OTHER PUBLICATIONS

Written Opinion of the International Searching Authority issued in PCT/JP2017/025603, dated Oct. 3, 2017.

* cited by examiner

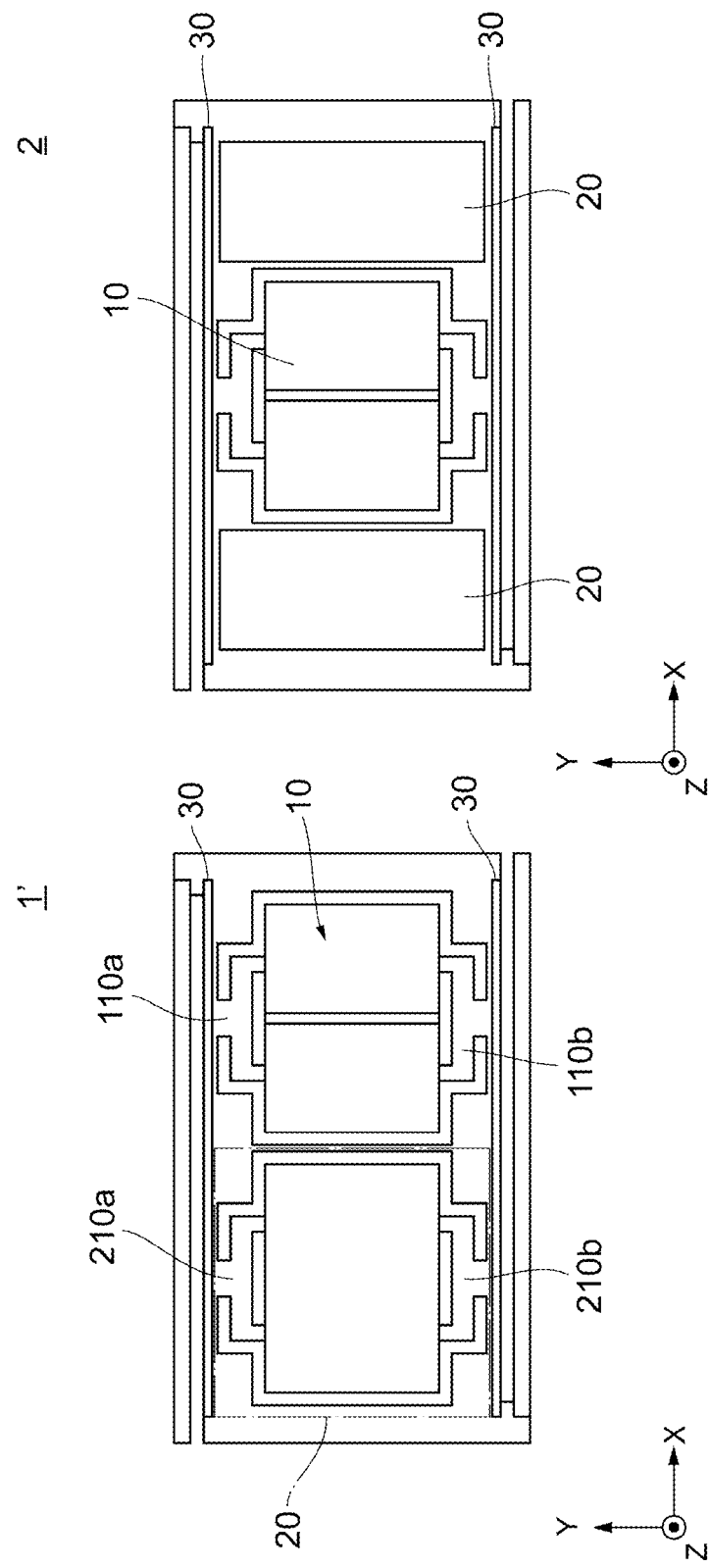

RESONANCE DEVICE

CROSS REFERENCE TO RELATED APPLICATIONS

This is a continuation application of international Application No. PCT/JP2017/025603, with an international filing date of Jul. 13, 2017, which claims priority of Japanese Patent Application No. 2016-253232 filed on Dec. 27, 2016, the entire contents of each of the applications are incorporated herein by reference.

TECHNICAL FIELD

The present invention relates to a resonance device.

BACKGROUND

Precisely controlling the oscillating frequency of an oscillator is important in apparatuses for which precise frequency information of GPS (global positioning system) and the like is required. For example, to maintain a constant oscillating frequency in a resonator that uses MEMS (micro electro mechanical systems) technology, the temperature of the resonator is required to be maintained constant.

For example, Patent Document 1 (identified below) discloses a resonance device including a resonator, a heater, a temperature sensor, and a control circuit that are integrally formed on a substrate.

Patent Document 1: U.S. Pat. No. 7,427,905.

In an existing resonance device, such as that described in Patent Document 1, a resonator is formed with a predetermined space from a substrate to prevent vibrations of the resonator from being hampered. Meanwhile, a sensor is formed on the substrate, and thus, the heat of a heater is easily conducted to the sensor compared with to the resonator. As a result, a discrepancy between a temperature sensed by the sensor and an actual temperature of the resonator is generated, which makes it difficult to perform precise temperature control.

SUMMARY OF THE INVENTION

The present invention is developed on the basis of such a circumstance. Thus, it is an object of the present invention is to improve the precision of temperature control in a resonance device.

Accordingly, a resonance device according to an exemplary aspect of the present invention is provided that includes a platform, a vibrator, a resonator including at least one first holding arm that connects the vibrator and the platform to each other such that a first groove is provided around the vibrator, a sensor including a measurement portion that measures temperature, and a heater formed on the platform. Moreover, a second groove is provided between the measurement portion and the heater.

According to the exemplary embodiments of the present invention, it is possible to improve the precision of temperature control in a resonance device.

BRIEF DESCRIPTION OF DRAWINGS

FIGS. 4(A) and 4(B) are views for describing an effect of the resonance device according to the first exemplary embodiment.

DETAILED DESCRIPTION OF EMBODIMENTS

First Exemplary Embodiment

Figure 1:
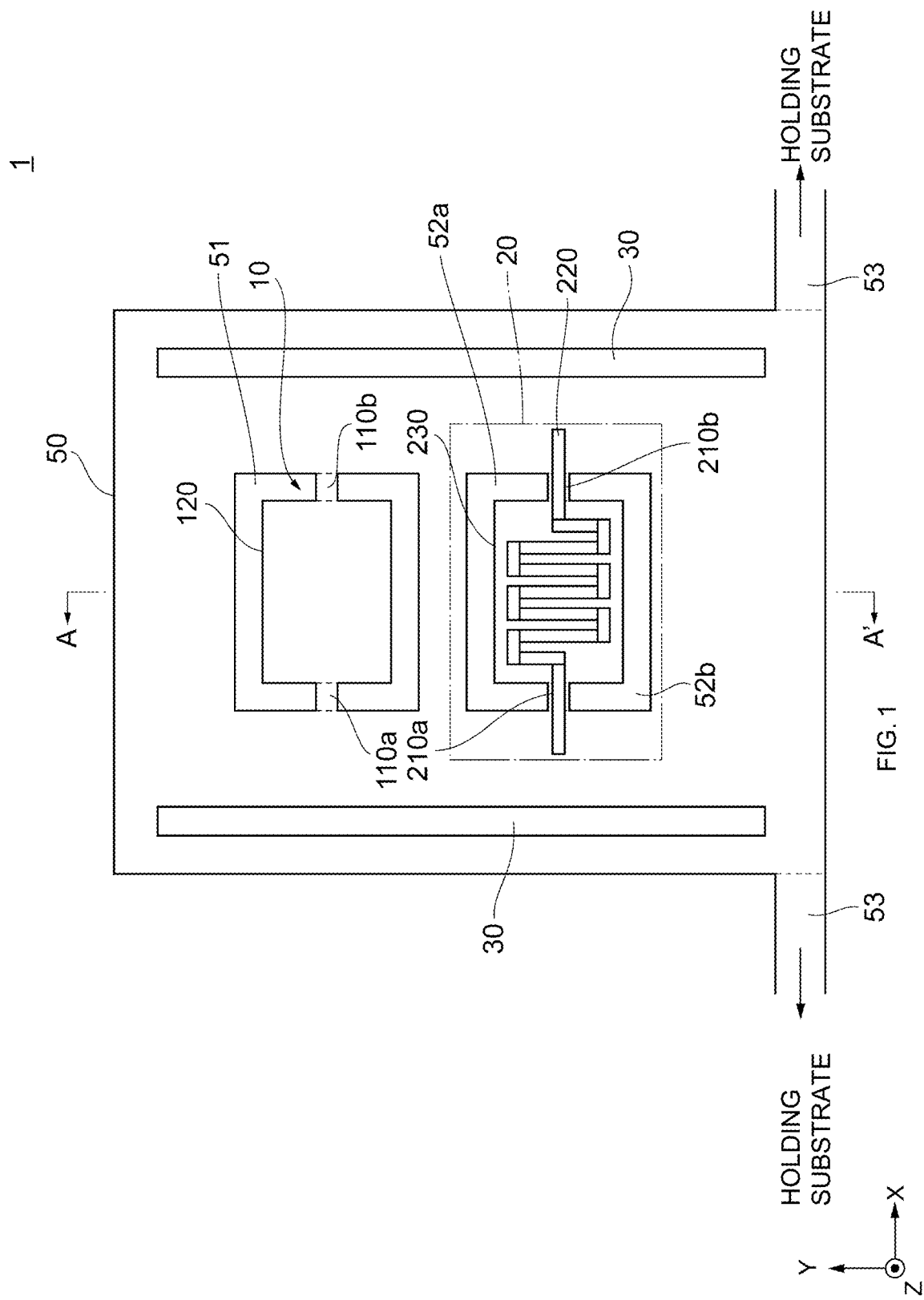
FIG. 1 is a plan view schematically illustrating a resonance device according to a first exemplary embodiment.

Hereinafter, a first exemplary embodiment of the present disclosure will be described with reference to the attached drawings. FIG. 1 is a plan view schematically illustrating a structure of a resonance device 1 according to the first exemplary embodiment.

1. Configuration

As generally shown, the resonance device 1 includes a platform 50, a resonator 10, a sensor 20, and heaters 30.

The platform 50 includes connecting arms 53 and is held at a holding substrate (not illustrated) by the connecting arms 53. The holding substrate and the platform 50 are integrally formed of Si (silicon) with a thickness of approximately 10 μm. In the present embodiment, the platform 50 has a plate shape extending from an end portion (hereinafter also referred to as the "rear end") on the side held at the holding substrate by the connecting arms 53 toward an open end (hereinafter, also referred to as the "front end"). The platform 50 has a length of approximately 0.4 mm in the Y-axis direction and a width of approximately 0.2 mm in the X-axis direction.

The platform 50 includes a predetermined space 51 (an example of a first groove). The space 51 is a through hole that is formed at a region adjacent to the front end of the platform 50 and that has a rectangular contour in plan view. The platform 50 is formed to be a frame shape that includes the space 51. At regions each adjacent to a respective one of two end portions (hereinafter also referred to as the "side ends") that connect the rear end and the front end of the platform 50 to each other, the heaters 30 are each disposed along a respective sides of the two side ends.

According to an exemplary aspect, the resonator 10 is an MEMS resonator manufactured using the MEMS technology. In the present embodiment, the resonator 10 is an in-plane vibrator configured to vibrate in a fundamental-wave contour vibration mode. The resonator 10 is, however, not limited thereto and may be an in-plane vibrator configured to vibrate in a harmonic contour vibration mode or may be an out-of-plane flexural vibrator.

In the present embodiment, the resonator 10 that is formed by using a silicone substrate (Si substrate) is described as an example; however, the silicon substrate is not limited to a substrate formed by only a silicon material. As described later, the silicon substrate includes a substrate doped with an N-type semiconductor material, such as P (phosphorus) (for example, substrate formed by a degenerate semiconductor). The substrate used for the resonator 10 may be a SiC substrate, a SiO$_2$ substrate, and the like, which include materials other than silicon.

The resonator 10 includes a vibrator 120 and holding arms 110a and 110b (hereinafter, also collectively referred to as the "holding arm 110"; an example of a first holding arm).

The vibrator 120 has a rectangular contour extending along the XY plane in the orthogonal coordinate system in FIG. 1. The vibrator 120 is disposed inside the space 51 in the platform 50. The vibrator 120 has a length of approximately 0.11 mm in the X-axis direction and a width of approximately 0.08 mm in the Y-axis direction.

The holding arm 110 is a square-column shaped arm and is disposed inside the platform 50 and in the space 51 between the short side of the vibrator 120 and the platform 50. The holding arms 110a and 110b each connect a substantially center portion (a region of the vibrator 120 adjacent to the heater 30) of a corresponding one of the short sides of the vibrator 120 to the region of the platform 50 where the heater 30 is disposed (that is, the region adjacent to the side end). The holding arm 110 has a length of approximately 12 µm in the X-axis direction and a width of approximately 6 µm in the Y-axis direction.

The holding arm 110 may include a buffer at an intermediate portion thereof. The buffer is, for example, a semicircular plate or a plate having a substantially rectangular shape perpendicularly intersecting the holding arm 110. When the buffer is a semicircular plate, the buffer preferably has a diameter on the side of the vibrator 120 and a vertex on the side of the platform 50. When the buffer is a plate having a substantially rectangular shape perpendicularly intersecting the holding arm 110, the length of the buffer in a direction perpendicular to the holding arm 110 is preferably approximately one-fourth the wave length of the resonator 10. When the holding arm 110 includes the buffer, it is possible to suppress vibrations from being hampered as a result of the vibrator 120 being held, which makes it possible to reduce degradation of the Q value of the resonator 10. In particular, it is possible to increase the effect by forming a hole portion in the buffer.

As a result of the resonator 10 including the vibrator 120 and the holding arm 110 described above, two spaces symmetrical to each other with the holding arm 110 therebetween are formed as the space 51. Specifically, one of the two spaces forming the space 51 extends along the contour of the vibrator 120 vertically to the long sides of the holding arm 110a and turns at an end portion of the vibrator 120 in the X-axis direction. The space 51 further extends along the vibrator 120 to an end portion of the vibrator 120 and turns in the Y-axis direction. The other of the two spaces has a configuration symmetrical to that of the one of the two spaces, and thus, description thereof is omitted. The space 51 is formed through patterning by, for example, dry etching or the like.

The sensor 20 is arranged adjacent to the resonator 10 in a direction along the heaters 30. In the present embodiment, the sensor 20 is disposed closer, than the resonator 10, to the rear end of the platform 50.

The sensor 20 includes a thin-film resistance 220, a measurement portion 230, holding arms 210a and 210b (hereinafter, also collectively referred to as the "holding arm 210"; an example of a second holding arm), and slits 52a and 52b (hereinafter, also collectively referred to as the "slit 52"; an example of a second groove).

The thin-film resistance 220 is a thermal-resistance temperature sensor that is formed by, for example, Mo (molybdenum) and that is formed on a surface of the sensor 20. The thin-film resistance 220 preferably has a certain path length and, in the present embodiment, the thin-film resistance 220 is formed through patterning into a meander shape.

The measurement portion 230 is a region extending around the thin-film resistance 220 and has a rectangular contour extending along the XY plane in the orthogonal coordinate system in FIG. 1. Specifically, the measurement portion 230 has a shape congruent with the shape of the vibrator 120 and has a length of approximately 0.11 mm in the X-axis direction and a width of approximately 0.08 mm in the Y-axis direction.

The holding arm 210 is a square-column shaped arm, as is the holding arm 110, and is disposed inside the platform 50 and in a space (slit 52) between the short side of the measurement portion 230 and the platform 50. The holding arm 210 connects a substantially center portion (a region of the measurement portion 230 adjacent to the heater 30) of the short side of the measurement portion 230 to the region of the platform 50 where the heater 30 is disposed (that is, the region adjacent to the side end). The holding arm 210 has a shape congruent with the shape of the holding arm 110 and has a length of approximately 12 µm in the X-axis direction and a width of approximately 6 µm in the Y-axis direction.

The slits 52a and 52b are grooves that are formed so as to be symmetrical to each other between the measurement portion 230 and the heaters 30. The slit 52a is formed around the thin-film resistance 220, with the measurement portion 230 and the holding arms 210a and 210b remaining, such that the shape of the contour of the measurement portion 230 and the holding arm 210 of the sensor 20 is congruent with the shape of the contour of the vibrator 120 and the holding arm 110 of the resonator 10. Specifically, the slit 52a extends along the contour of the thin-film resistance 220 vertically to the long side of the holding arm 210a and turns at an end portion of the thin-film resistance 220 along the thin-film resistance 220 in the X-axis direction. The slit 52 further extends along the thin-film resistance 220 to an end portion of the thin-film resistance 220 and turns in the Y-axis direction. The slit 52b has a configuration symmetrical to that of the slit 52a, and thus, description thereof is omitted. The slit 52 is formed through patterning by, for example, dry etching or the like.

As a result of the slit 52 being formed between the measurement portion 230 and the heaters 30, it is possible to reduce heat conductance to the sensor 20. In particular, as a result of the resonator 10 and the sensor 20 (specifically, the contour of the vibrator 120 and the holding arm 110 of the resonator 10 and the contour of the measurement portion 230 and the holding arm 210 of the sensor 20) having shapes congruent with each other, heat conductance of the heat emitted by the heater 30 is similar between the resonator 10 and the sensor 20. When the holding arm 110 of the resonator 10 is connected to the regions of the platform 50 where the heaters 30 are disposed, the holding arm 210 is also preferably connected to the regions of the platform 50 where the heaters 30 are disposed. Consequently, it is possible to cause heat conductance to be more similar between the resonator 10 and the sensor 20.

The heaters 30 are formed along the long sides of the platform 50 so as to extend from the rear end to the front end of the platform 50. The heaters 30 are preferably formed on the platform 50 so as to at least extend from the holding arm 110 to the holding arm 210. More preferably, the shapes and the positions of the heaters 30 are line-symmetrical with respect to a line segment that is formed by connecting points away from the holding arm 110 and from the holding arm 210 by an equal distance. Consequently, heat conductance from the heaters 30 to the holding arm 110 and heat conductance from the heaters 30 to the holding arm 210 are easily made to be similar. In the present embodiment, the two heaters 30 are disposed at the regions of the two end portions connecting the front end and the rear end of the platform 50 so as to extend along the long sides of the platform 50; however, the heaters 30 are not limited thereto. A configuration in which one heater 30 is disposed along one long side of the platform 50 may be employed.

The heaters 30 are formed on the platform 50 by, for example, subjecting a thin film formed by Mo (molybdenum) to sputtering or the like. Precise patterning is possible by using photo-etching or the like. The heaters 30 each have a controller, not illustrated, and are capable of controlling an amount of heat generation in accordance with a temperature sensed by the sensor 20.

2. Stacked Structure

Figure 2:
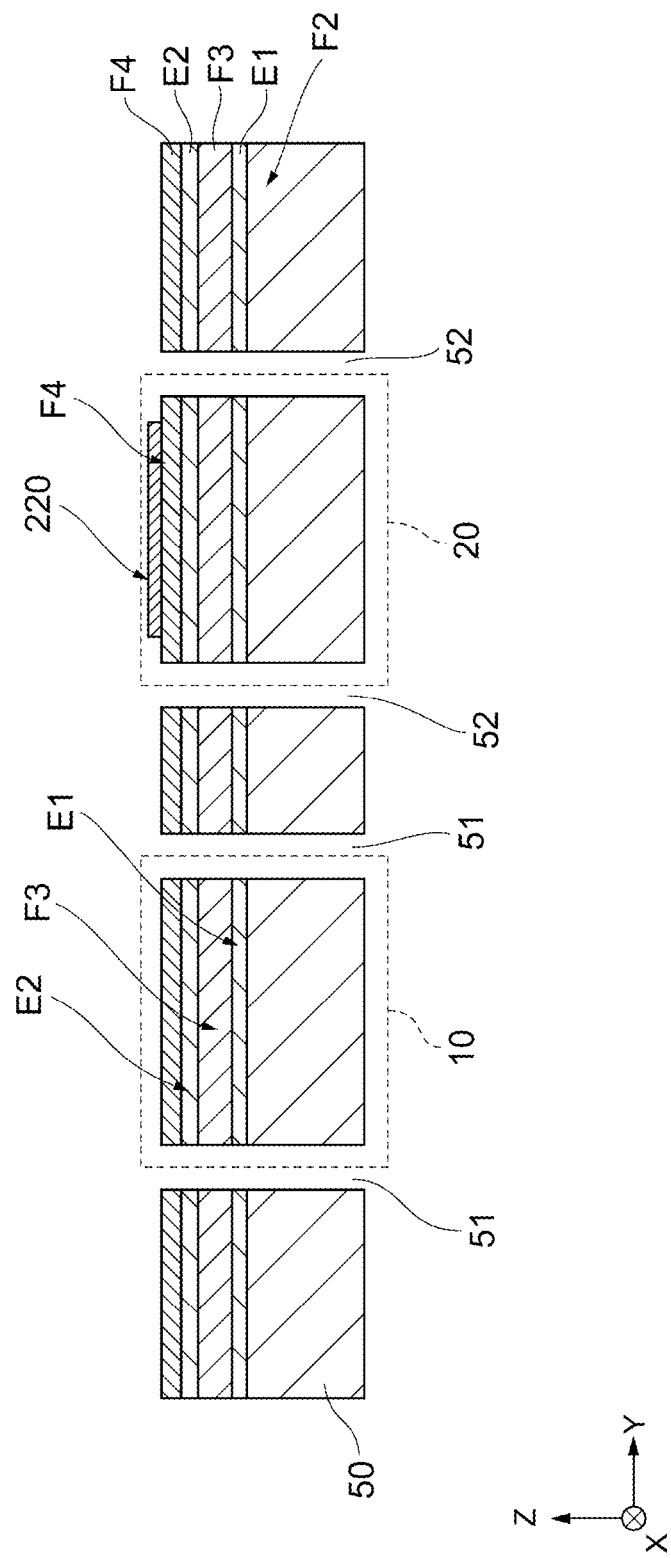
FIG. 2 is a sectional view taken along line A-A' in FIG. 1.

With reference to FIG. 2, a stacked structure of the resonance device 1 will be described. FIG. 2 is a sectional view taken along line A-A' in FIG. 1.

In the resonance device 1 according to the present embodiment, the resonator 10, the sensor 20, and the platform 50 are integrally formed in the same process. As illustrated in FIG. 2, in the resonance device 1, first, a lower electrode E1 is stacked on a Si (silicon) substrate F2 (an example of a substrate). A seed layer (not illustrated) may be disposed between the Si substrate F2 and the lower electrode E1. A piezoelectric thin film F3 (an example of a piezoelectric body) is stacked on the lower electrode E1 so as to cover the lower electrode E1, and an upper electrode E2 is further stacked on the piezoelectric thin film F3. In addition, an insulating film F4 is disposed on the upper electrode E2, and, at the sensor 20, the thin-film resistance 220 is further disposed on the insulating film F4. A film that is made of a material identical to that of the thin-film resistance 220 and that has an appropriate shape may be disposed on the insulating film F4 at the resonator 10 to cause the thermal capacity of the resonator 10 to coincide with the thermal capacity of the sensor.

The Si substrate F2 is formed of, for example, a degenerate n-type Si semiconductor having a thickness of approximately 10 μm and may contain P (phosphorus), As (arsenicum), or Sb (antimony) as an n-type dopant, and B (boron) or the like as a p-type dopant. As a result of the Si substrate F2 being formed by degenerate Si, it is possible to improve temperature characteristics of resonance frequencies. A temperature-characteristic correction layer formed by silicon oxide (for example, $SiO_2$) may be disposed on an upper surface or a lower surface of the Si substrate F2. As such, it is further possible to improve the temperature characteristics.

The piezoelectric thin film F3 is a thin film of a piezoelectric body that is configured to convert an applied voltage into vibrations, and the piezoelectric thin film F3 may contain, for example, nitride, such as AlN (aluminum nitride), or oxide as a main component. Specifically, the piezoelectric thin film F3 may be formed of ScAlN (scandium aluminum nitride). ScAlN is aluminum nitride in which a portion of aluminum is replaced with scandium. The piezoelectric thin film F3 has a thickness of, for example, approximately 1 μm.

The piezoelectric thin film F3 expands and contracts in an in-plane direction of the XY plane, that is, in the Y-axis direction in accordance with an electric field applied to the piezoelectric thin film F3 by the upper electrode E2 and the lower electrode E1. Specifically, the piezoelectric thin film F3 is oriented in a c-axis direction, and thus, when a predetermined electric field is applied to the upper electrode E2 and the lower electrode E1 to form a predetermined potential difference between the upper electrode E2 and the lower electrode E1, the piezoelectric thin film F3 expands and contracts in accordance with the potential difference in the in-plane direction of the XY plane, which causes the vibrator 120 to perform contour vibration.

The upper electrode E2 and the lower electrode E1 are formed by using Mo (molybdenum), aluminum (Al), or the like. When degenerated Si is used as the Si substrate F2, the Si substrate F2 is capable of functioning additionally as the lower electrode E1. In other words, when the Si substrate F2 has a function as a lower electrode, the configuration of the lower electrode E1 may be omitted. In the present embodiment, the thickness of each of the lower electrode E1 and the upper electrode E2 is, for example, approximately 0.1 μm.

The upper electrode E2 and the lower electrode E1 are each formed into a desired shape by etching or the like. The lower electrode E1 is formed so as to, for example, function, at the vibrator 120, as an electrode of a lower portion. The lower electrode E1 is formed so as to function, at the holding arm 110 and at the platform 50, as wiring for connecting the lower electrode to an alternating current power source disposed outside the resonance device 1.

Meanwhile, the upper electrode E2 is formed so as to function, at the vibrator 120, as an electrode of an upper portion. The upper electrode E2 is formed so as to function, at the holding arm 110 and the platform 50, as wiring for connecting the upper electrode to the alternating current power source disposed outside the resonance device 1.

In the present embodiment, the lower electrode E1 and the upper electrode E2 are formed so as to cover the entire surface of the vibrator 120. In this case, it is possible to excite the vibrator 120 by connecting one to an input side and the other to an output side. An appropriate shape is selectable for each of the lower electrode E1 and the upper electrode E2 in accordance with vibration mode. For example, in a second-harmonic vibration mode, the lower electrode E1 is formed on the entire surface of the vibrator 120, the upper electrode E2 is formed so as to be divided at a substantially center portion of the long side of the vibrator 120, and the divided portions of the upper electrode E2 are connected to the input and the output, respectively, to thereby enable excitation of the vibrator 120.

According to an exemplary aspect, the insulating film F4 is formed by, for example, silicon oxide, AlN (aluminum nitride), or the like. Moreover, the thin-film resistance 220 can be formed by Mo. It is possible to precisely form the thin-film resistance 220 by using photo-etching or the like after forming a Mo film. It is possible to simplify the step of forming the thin-film resistance 220 by forming the thin-film resistance 220 and Mo films of the heaters 30 at the same time and performing photo-etching at the same time. When employing Mo as a material for all of the thin-film resistance 220 (temperature sensor), the upper electrode E2 and the lower electrode E1 of the resonator, and the heater 30, it is possible to simplify the manufacturing process, which enables a reduction in manufacturing costs.

While the piezoelectric thin film F3, the lower electrode E1, and the upper electrode E2 are not required at the sensor 20, as a result of the sensor 20 having a stacked structure identical to that of the resonator 10, it is possible to cause thermal conductivity and thermal capacity to be similar to those of the resonator 10.

Figure 3:
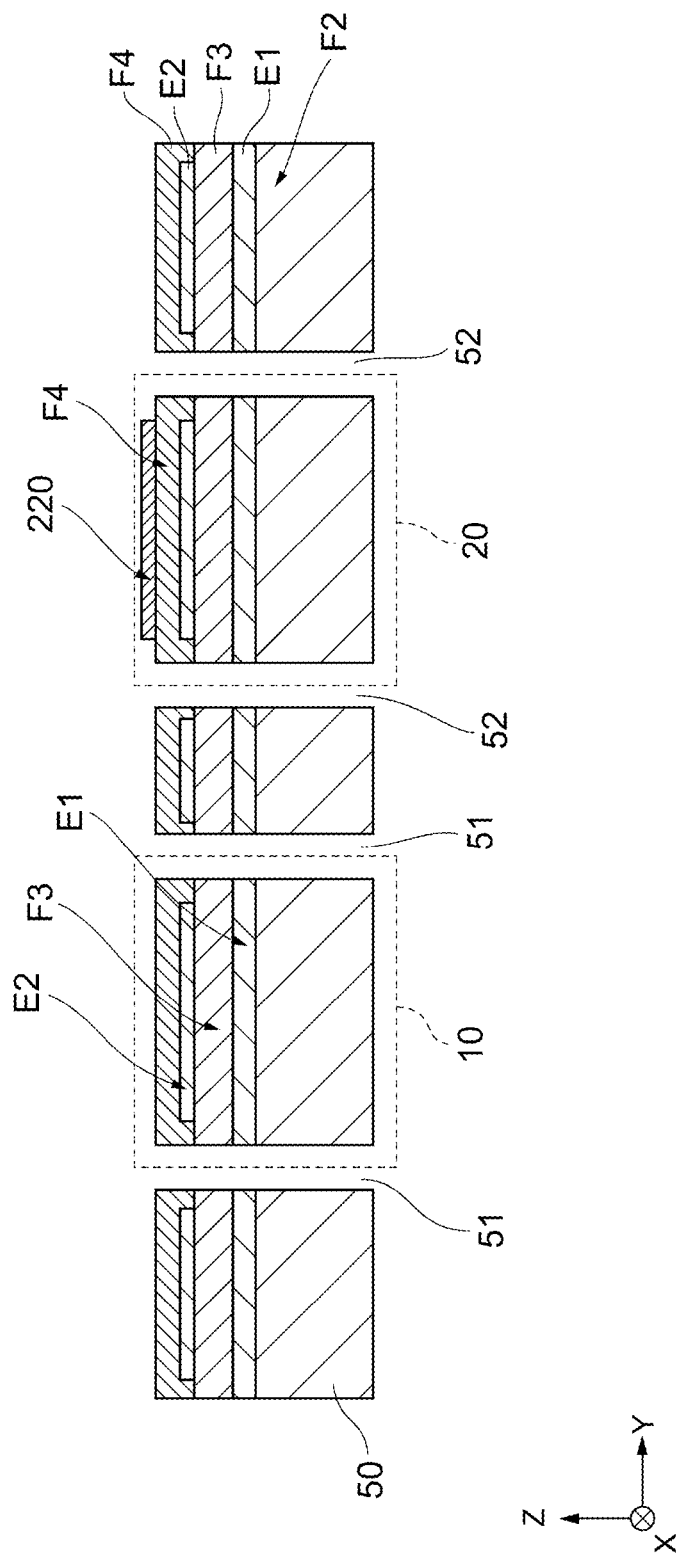
FIG. 3 is a view illustrating a modification of a cross-section taken along line A-A' in FIG. 1.

With reference to FIG. 3, a modification of the stacked structure will be described. FIG. 3 illustrates a modification of a cross-section taken along line A-A' in FIG. 1. In FIG. 2, the upper electrode E2 is formed so as to extend to the end portions of each of the resonator 10 and the sensor 20. However, the stacked structure of the resonance device 1 according to the present embodiment is not limited thereto; for example, as illustrated in FIG. 3, the upper electrode E2 may not be formed so as to extend to the end portions of each of the resonator 10 and the sensor 20. In this case, the upper electrode E2 is covered, at the end portions of each of the resonator 10 and the sensor 20, by the insulating film F4. Consequently, it is possible to improve insulation between the upper and lower electrodes.

3. Simulation Results

Next, with reference to FIGS. 4(A) and (B) and 5(A) and 5(B), effects of the resonance device 1 according to the present invention will be described. FIG. 4(A) illustrates a configuration of a resonance device 1' as a modification of the resonance device 1 according to the present embodiment. In the resonance device 1' of the modification, the resonator 10 performs contour vibration in the second harmonic vibration mode. The holding arm 110 includes the aforementioned buffer in a direction (X-axis direction in FIG. 4) along the vibration direction of the resonator 10. In the resonance device 1' of the modification, the sensor 20 also has a shape congruent with the shape of the resonator 10. FIG. 4(B) illustrates a configuration of a resonance device 2 in a comparative example. In the resonance device 2 of the comparative example, the shape of the resonator 10 is identical to that in the resonance device 1' of the modification; however, the shape of the sensor 20 is not congruent with the shape of the resonator 10. Specifically, the sensor 20 includes no slit around the thin-film resistance 220. In the resonance device 2 of the comparative example, two sensors 20 are disposed with the resonator 10 therebetween.

Figure 5A:
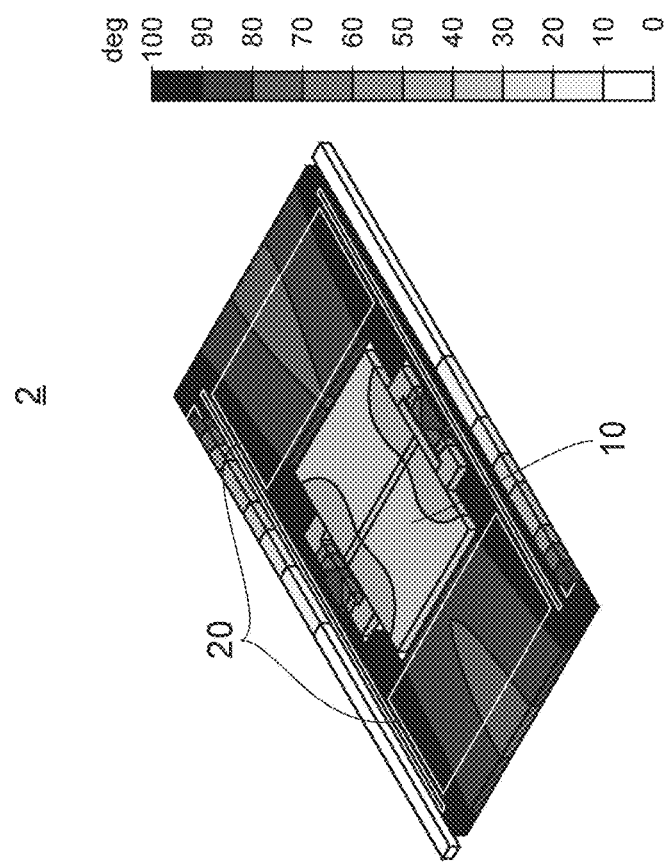
FIGS. 5(A) and 5(B) are views for describing an effect of the resonance device according to the first exemplary embodiment.
Figure 5B:
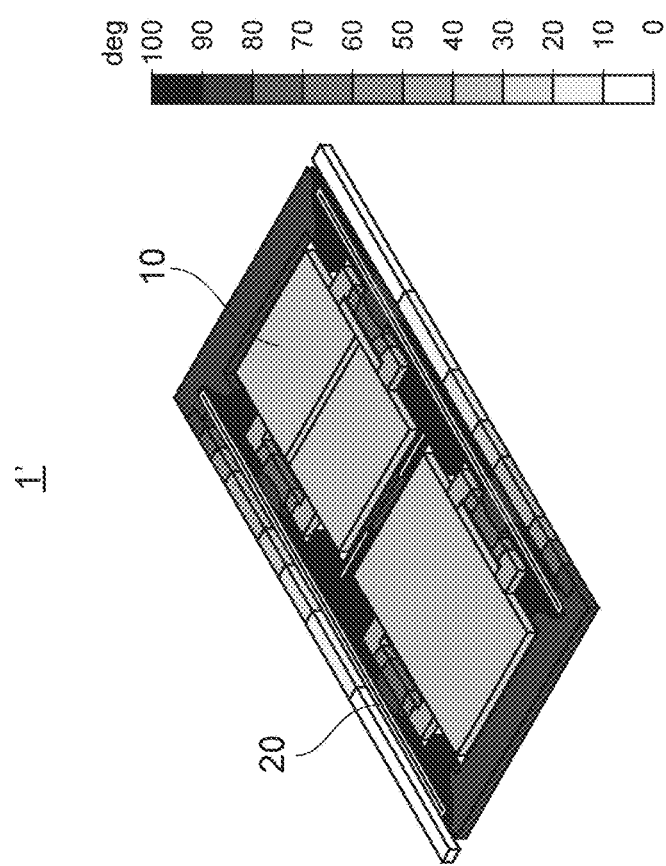

FIGS. 5(A and 5(B) illustrate results of temperature distribution simulation by FEM for the resonance device 1' (FIG. 5(A)) of the modification and the resonance device 2 (FIG. 5(B)) of the comparative example illustrated in FIG. 4. As shown, a pale-colored region indicates a low-temperature region, and a dark-colored region indicates a high-temperature region. As illustrated in FIG. 5(A), in the resonance device 1' of the modification, the temperature of the resonator 10 and the temperature of the sensor 20 are substantially identical to each other. In contrast, as illustrated in FIG. 5(B), in the resonance device 2 of the comparative example, the temperature of the sensor 20 is high compared with the temperature of the resonator 10. In the resonance device 2 of the comparative example, since no slit is provided between the sensor 20 and the heaters 30, the heat of the heaters 30 is easily conducted to the sensor 20 compared with to the resonator 10. It is thus difficult in the resonance device 2 of the comparative example to measure the temperature of the resonator 10 by using the sensor 20. In contrast, in the resonance device 1' of the modification, temperature is uniformly distributed in the resonator 10 and the sensor 20, which enables precise temperature control.

As described above, in the resonance device 1 according to the present embodiment, the material and the film configuration of the sensor 20 are identical to those of the resonator 10, and the sensor 20 thus has thermal capacity substantially identical to that of the resonator 10. Moreover, the shape of the holding arm 210 of the sensor 20 and the shape of the holding arm 110 are congruent with each other, and the sensor 20 and the resonator 10 thus have identical thermal resistance. Further, in the present embodiment, the resonator 10 and the sensor 20 (specifically, the vibrator 120 and the holding arm 110 of the resonator 10, and the measurement portion 230 and the holding arm 210 of the sensor 20) have shapes congruent with each other; thus, the value of thermal time constant τ (thermal capacity×thermal resistance) of the sensor 20 and that of the resonator 10 are substantially identical to each other. As a result, the sensor 20 is capable of precisely sensing the temperature of the resonator 10, which makes it possible to improve the precision of temperature control by the heaters 30. When the resonator 10 and the sensor 20 differ from each other in terms of shape and area, the width and the length of the holding arm 210 are adjusted to control the thermal time constant of the sensor 20 so as to coincide with the time constant of the resonator 10.

Second Exemplary Embodiment

In a second exemplary embodiment and subsequent embodiments, description of matters common to the first embodiment are omitted, and only differences will be described. In particular, identical effects due to identical configurations will not be mentioned individually for each embodiment.

Figure 6:
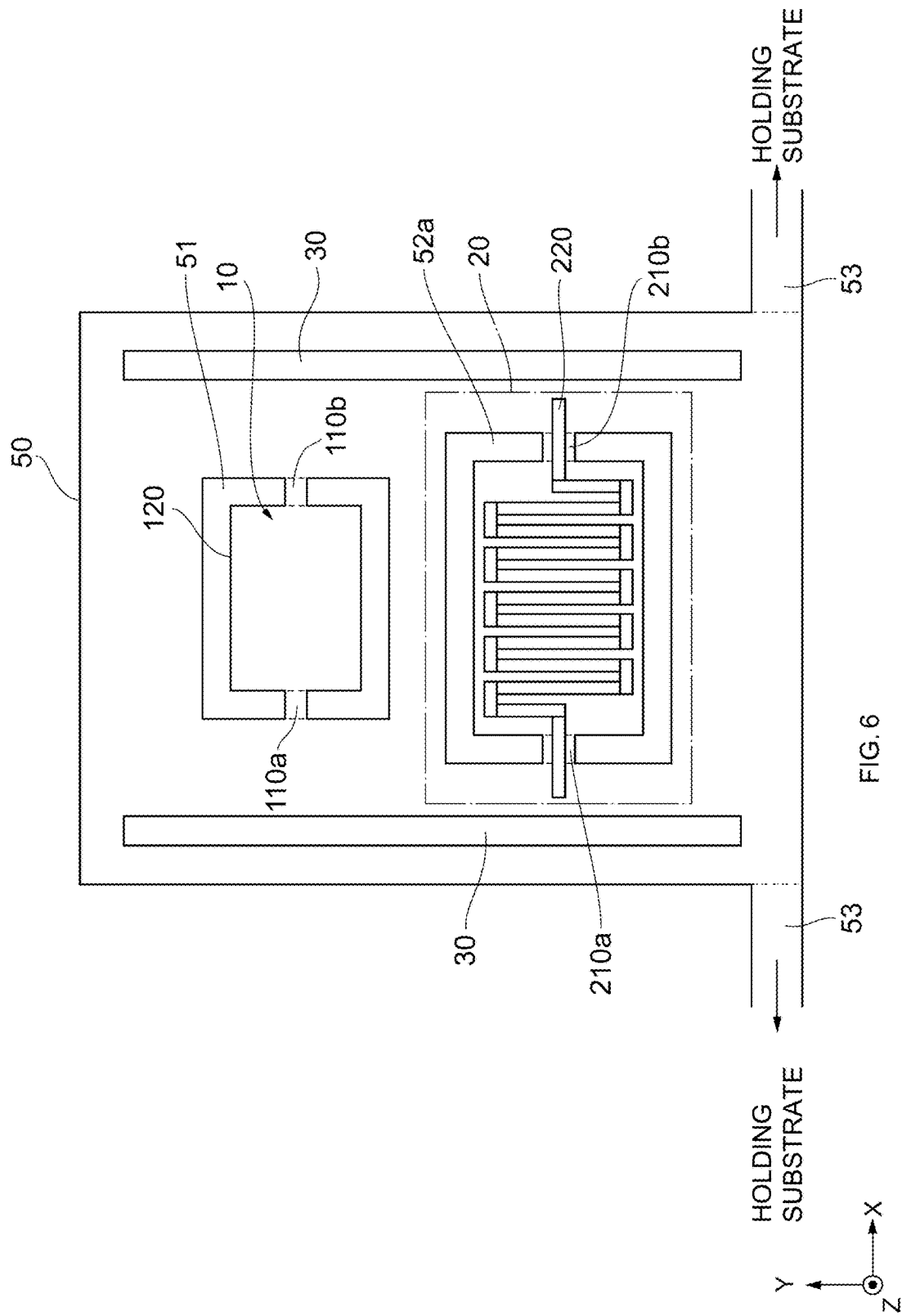
FIG. 6 is a plan view schematically illustrating a resonance device according to a second exemplary embodiment.

With reference to FIG. 6, a configuration and a function of the resonance device 1 according to the second embodiment will be described. In the present embodiment, as illustrated in FIG. 6, the sensor 20 has an area larger than the area of the resonator 10 and has a shape analogous to the shape of the resonator 10. When the resonator 10 is small, if the sensor 20 has a shape congruent with the shape of the resonator 10, it is not possible to ensure a sufficient path length of the thin-film resistance 220. In this case, the area of the sensor 20 (in particular, the measurement portion 230) is increased so as to be larger than the area of the resonator 10, and the length and the width of the holding arm 210 are adjusted such that the thermal time constant is identical between the resonator 10 and the sensor 20, thereby enabling an equal temperature between the resonator 10 and the sensor 20. Other configurations and other functions are identical to those in the first embodiment.

Third Exemplary Embodiment

Figure 7:
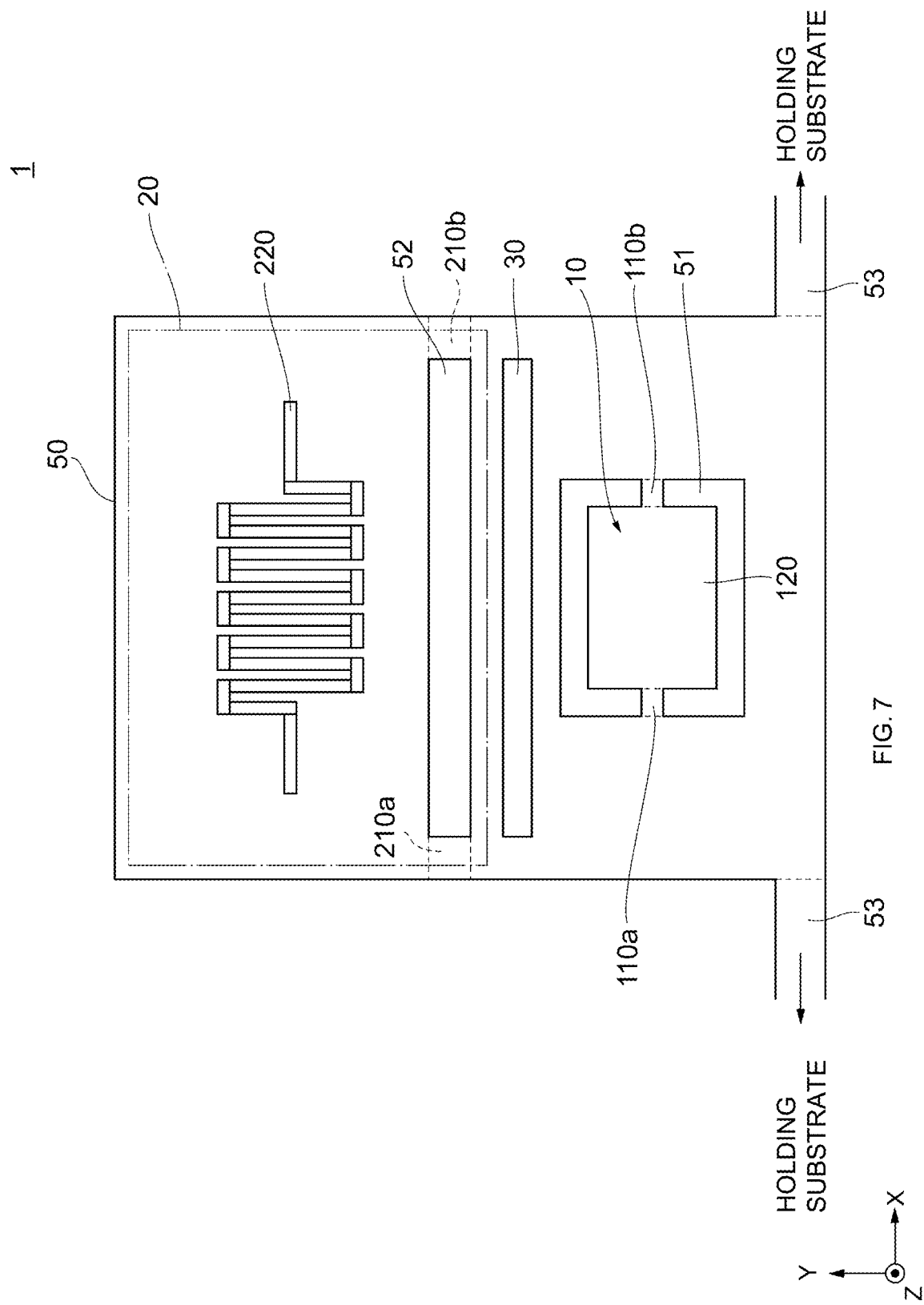
FIG. 7 is a plan view schematically illustrating a resonance device according to a third exemplary embodiment.

With reference to FIG. 7, a configuration and a function of the resonance device 1 according to a third exemplary embodiment will be described. Hereinafter, detailed configurations of the resonance device 1 according to the present embodiment will be described focusing on differences from the first embodiment.

In the present embodiment, one heater 30 is disposed at a region at a substantially center between the rear end and the front end of the platform 50 so as to extend between the sensor 20 and the resonator 10 in the X-axis direction vertically to the side ends.

In the present embodiment, the resonator 10 and the space 51 are disposed at a region of the platform 50 adjacent to the rear end, and the sensor 20 is disposed at a region closer, than the resonator 10, to the front end.

The slit 52 is provided around the thin-film resistance 220 (that is, around the measurement portion 230) on only one side. Specifically, the slit 52 is provided only at a region between the heater 30 and the thin-film resistance 220 so as to extend along the heater 30. The holding arms 210a and 210b are each disposed in a region between the slit 52 and a corresponding one of the side ends of the platform 50. Other configurations and other functions are identical to those in the first embodiment.

Fourth Exemplary Embodiment

Figure 8:
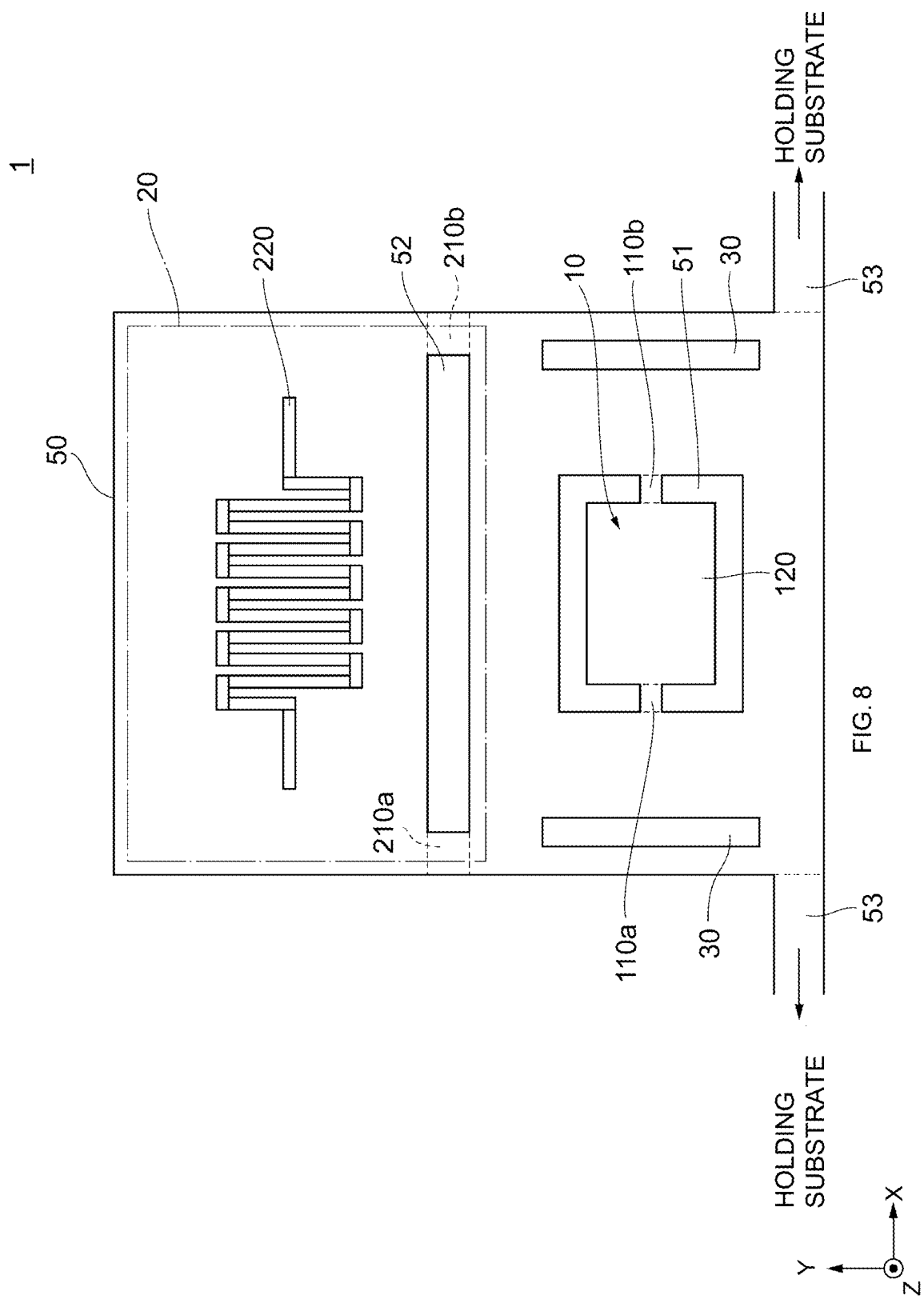
FIG. 8 is a plan view schematically illustrating a resonance device according to a fourth exemplary embodiment.

With reference to FIG. 8, a configuration and a function of the resonance device 1 according to a fourth exemplary embodiment will be described. Hereinafter, detailed configurations of the resonance device 1 according to the present embodiment will be described focusing on differences from the third embodiment.

In the present embodiment, the heater 30 is disposed, along the side ends of the platform 50, one each (two in total) at regions of the two side ends. Each heater 30 is disposed so as to face a corresponding one of the short sides of the vibrator 120 of the resonator 10. In the present embodiment, the slit 52 is disposed at a location identical to that in the third embodiment; however, each of the heaters 30 is not disposed at a region closer, than the slit 52, to the front end.

Other configurations and other functions are identical to those in the third embodiment.

Fifth Exemplary Embodiment

Figure 9:
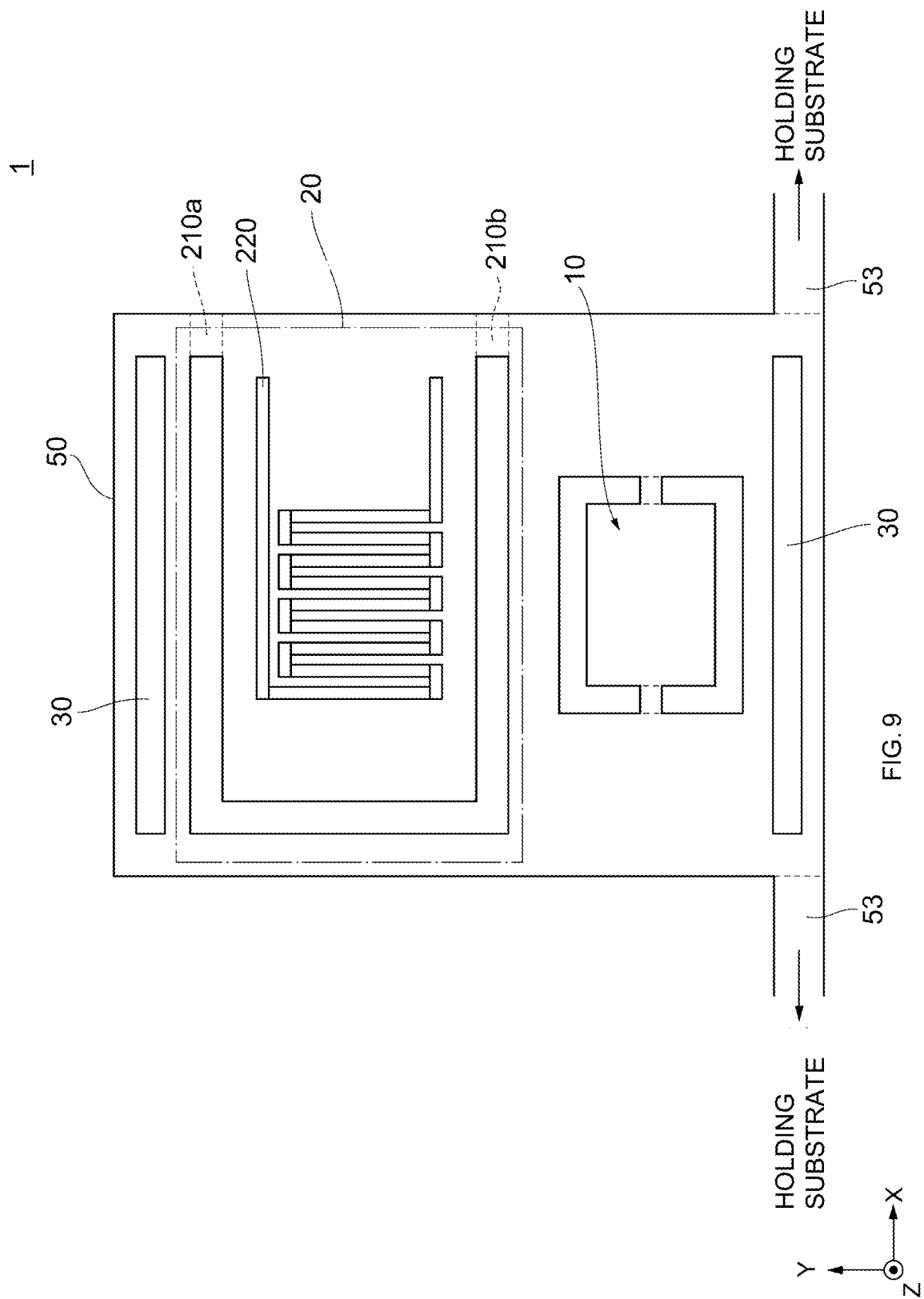
FIG. 9 is a plan view schematically illustrating a resonance device according to a fifth exemplary embodiment.

With reference to FIG. 9, a configuration and a function of the resonance device 1 according to the fifth exemplary embodiment will be described. Hereinafter, detailed configurations of the resonance device 1 according to the present embodiment will be described focusing on differences from the first embodiment.

In the present embodiment, the resonance device 1 includes two heaters 30. The heaters 30 are disposed at a region of the front end and a region of the rear end of the platform 50, respectively, so as to extend along the rear end (or front end) and face each other with the resonator 10 and the sensor 20 therebetween.

In the present embodiment, each of the resonator 10 and the space 51 is disposed at a region of the platform 50 adjacent to the rear end, and the sensor 20 is disposed at a region closer, than the resonator 10, to the front end.

The slit 52 is provided around the thin-film resistance 220 (that is, around the measurement portion 230) so as to surround three sides and is not provided at a region of the platform 50 adjacent to one of the side ends. More specifically, the slit 52 extends from the region of the platform 50 adjacent to the one of the side ends along the outer circumference of the thin-film resistance 220 in parallel to the front end and turns, at a region of the platform 50 adjacent to the other of the side ends, in the Y-axis direction along the outer circumference of the thin-film resistance 220. The slit 52 further extends along the outer circumference of the thin-film resistance 220 in parallel to the side ends of the platform 50, turns again in the X-axis direction at an end portion of the thin-film resistance 220, and extend along the rear end of the platform 50 to a region of one of the side ends. As a result, the holding arm 210 is formed between the one of the side ends of the platform 50 and the slit 52. Other configurations and other functions are identical to those in the first embodiment.

Exemplary embodiments of the present invention have been described above. The resonance device 1 according to the present embodiment includes the platform 50, the resonator 10 including the vibrator 120 and at least one holding arm 110 that connects the vibrator 120 and the platform 50 to each other such that the space 51 is provided around the vibrator 120, the sensor 20 including the measurement portion 230 that measures temperature, and the heaters 30 formed on the platform 50. The slit 52 is provided between the measurement portion 230 and the heater 30. As a result of the slit 52 being provided between the measurement portion 230 and the heaters 30, it is possible to reduce heat conductance to the sensor 20. Consequently, it is possible to cause the temperature of the sensor 20 to be similar to the temperature of the resonator 10, which enables precise temperature control.

The sensor 20 preferably further includes at least one holding arm 210 that connects the measurement portion 230 and the platform 50 to each other such that the slit 52 is provided around the measurement portion 230. Moreover, the holding arm 110 and the holding arm 210 are preferably disposed adjacent to the heaters 30. Further, it is preferable that the holding arm 110 and the holding arm 210 be identical to each other in terms of number. In this preferable mode, it is possible to cause the heat conductance to be similar between the resonator 10 and the sensor 20.

The shape of the vibrator 120 and the holding arm 110 and the shape of the measurement portion 230 and the holding arm 210 are preferably analogous to each other. Moreover, the shape of the vibrator 120 and the holding arm 110 and the shape of the measurement portion 230 and the holding arm 210 are preferably congruent with each other. In this preferable mode, heat conductance of the heat emitted by the heater 30 is similar between the resonator 10 and the sensor 20.

The resonator 10 and the sensor 20 are desirably identical to each other in terms of thermal time constant and preferably identical to each other in terms of thermal capacity and thermal resistance. In this preferable mode, the sensor 20 is capable of precisely sensing the temperature of the resonator 10, which makes it possible to improve the precision of temperature control by the heaters 30.

It is noted that each of the exemplary embodiments described above is for ease of understanding the present invention and is not for limiting and interpreting the present invention. For example, the resonator has been described as a resonator that is formed by a piezoelectric thin film; however, the resonator may be an electrostatic-type MEMS resonator. In addition, the sensor and the heaters are each described as a thin-film resistance; however, a portion of the silicon substrate may be polycrystalline silicon.

Moreover, as should be appreciated to one skilled in the art, the exemplary embodiments of the present invention can be modified or improved without departing from the meaning thereof, and the present invention includes equivalents thereof. In other words, each of the embodiments to which a design change has been applied, as appropriate, by a person skilled in the art is included in the scope of the present invention provided that the features of the present invention are included therein. For example, each element included in each of the embodiments, and the arrangements, materials, conditions, shapes, sizes, and the like thereof are not limited to those indicated in the examples and can be changed, as appropriate. Needless to say, the embodiments are presented as examples, and partial replacement or a combination of the configurations presented in the different embodiments is possible, and these are also included in the scope of the present invention provided that the features of the present invention are included therein.

REFERENCE SIGNS LIST 1 resonance device
10 resonator 20 sensor
30 heater
50 platform
51 space
52 slit
52a slit
52b slit
53 connecting arm
110 holding arm
110a holding arm
110b holding arm
120 vibrator
210 holding arm
210a holding arm
210b holding arm
220 thin-film resistance
230 measurement portion

The invention claimed is:

1. A resonance device comprising:
a platform;
a resonator including a vibrator and at least one first holding arm that connects the vibrator to the platform such that a first groove extends around the vibrator;
a sensor including a measurement portion configured to measure temperature; and
at least one heater disposed on the platform,
wherein a second groove extends between the measurement portion and the at least one heater,
wherein the resonator is disposed adjacent to the measurement portion of the sensor, such that the resonator does not overlap the sensor of the measurement portion in a direction normal to a main surface of the vibrator.

2. The resonance device according to claim 1, wherein the sensor further includes at least one second holding arm that connects the measurement portion to the platform such that the second groove extends around the measurement portion.

3. The resonance device according to claim 2, wherein the at least one first holding arm and the at least one second holding arm are disposed adjacent to the heater.

4. The resonance device according to claim 2, wherein the at least one first holding arm and the at least one second holding arm comprise a same number of respective holding arms as each other.

5. The resonance device according to claim 2, wherein the vibrator and the at least one first holding arm collectively have a shape that is analogous to a collective shape of the measurement portion and the at least one second holding arm.

6. The resonance device according to claim 2, wherein the vibrator and the at least one first holding arm collectively have a shape that is congruent to a collective shape of the measurement portion and the at least one second holding arm.

7. The resonance device according to claim 1, wherein the resonator has an identical thermal time constant as the sensor.

8. The resonance device according to claim 1, wherein the resonator has an identical thermal capacity and thermal resistance as the sensor.

9. The resonance device according to claim 1, wherein the first groove is disposed between the resonator and the platform to form a gap therebetween, such that the first groove completely surrounds the resonator except where the at least one first holding arm connects the resonator to the platform.

10. The resonance device according to claim 9, wherein the second groove is disposed between the measurement portion and the platform to form a gap therebetween, such that the second groove completely surrounds the measurement portion except where the at least one second holding arm connects the measurement portion to the platform.

11. The resonance device according to claim 1, wherein the measurement portion is a region extending around a thin-film resistance and has a rectangular contour that extends in a width and length direction of the platform.

12. The resonance device according to claim 1, wherein the platform comprises a rectangular shape and the at least one heater comprises a pair of heaters extending parallel to respective opposing sides of the platform.

13. The resonance device according to claim 12, wherein the resonator and the sensor are symmetrically disposed relative to each other and between the pair of heaters.

14. The resonance device according to claim 12, wherein the at least one first holding arm extends in a direction perpendicular to a lengthwise direction of the pair of heaters.

15. A resonance device comprising:
a platform;
a resonator including a vibrator and a pair of first holding arms that connect the vibrator to the platform with a first groove extending around the vibrator;
a temperature sensor including a pair of second holding arms that connect the temperature sensor to the platform with a second groove extending around the temperature sensor; and
at least one heater disposed on the platform,
wherein the second groove is disposed between the temperature sensor and the at least one heater to reduce heat conductance to the temperature sensor,
wherein the resonator is disposed adjacent to the temperature sensor, such that the resonator does not overlap the temperature sensor in a direction normal to a main surface of the vibrator.

16. The resonance device according to claim 15, wherein the vibrator and the pair of first holding arms collectively have a shape that is analogous to a collective shape of the temperature sensor and the pair of second holding arms.

17. The resonance device according to claim 15, wherein the vibrator and the pair of first holding arms collectively have a shape that is congruent to a collective shape of the temperature sensor and the pair of second holding arms.

18. The resonance device according to claim 15, wherein the resonator has an identical thermal time constant as the temperature sensor.

19. The resonance device according to claim 15, wherein the resonator has an identical thermal capacity and thermal resistance as the temperature sensor.

20. The resonance device according to claim 15, wherein the temperature sensor comprises a measurement portion that is a region extending around a thin-film resistance and has a rectangular contour that extends in a width and length direction of the platform.

* * * * *